(12) United States Patent
Mitrovic (10) Patent No.: US 6,962,664 B2
(45) Date of Patent: Nov. 8, 2005

(54) CONTROLLED METHOD FOR SEGMENTED ELECTRODE APPARATUS AND METHOD FOR PLASMA PROCESSING

(75) Inventor: Andrej S. Mitrovic, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 10/357,434

(22) Filed: Feb. 4, 2003

(65) Prior Publication Data

US 2003/0137250 A1    Jul. 24, 2003

Related U.S. Application Data

(60) Division of application No. 10/189,425, filed on Jul. 8, 2002, now Pat. No. 6,863,020, which is a continuation of application No. PCT/US01/00120, filed on Jan. 3, 2001.

(60) Provisional application No. 60/175,284, filed on Jan. 10, 2000.

(51) Int. Cl.$^7$ ............................................. H01L 21/00
(52) U.S. Cl. ........................ 216/59; 216/67; 156/345.24
(58) Field of Search ................. 216/59, 67; 156/345.24

(56) References Cited

U.S. PATENT DOCUMENTS

| | | | | |
|---|---|---|---|---|
| 4,547,247 A | * | 10/1985 | Warenback et al. | 156/345.51 |
| 4,885,074 A | | 12/1989 | Susko et al. | |
| 5,006,192 A | * | 4/1991 | Deguchi | 156/345.44 |
| 5,006,760 A | | 4/1991 | Drake, Jr. | |
| 5,415,719 A | * | 5/1995 | Akimoto | 156/345.38 |
| 5,733,511 A | | 3/1998 | De Francesco | |
| 5,855,679 A | * | 1/1999 | Ogawa | 118/719 |
| 6,350,317 B1 | * | 2/2002 | Hao et al. | 118/71 |
| 6,351,683 B1 | * | 2/2002 | Johnson et al. | 700/121 |

FOREIGN PATENT DOCUMENTS

| | | | |
|---|---|---|---|
| JP | 57023227 | | 2/1982 |
| JP | 2000-208483 | * | 7/2000 |
| JP | 2000208483 | | 7/2000 |

* cited by examiner

Primary Examiner—Shamim Ahmed
(74) Attorney, Agent, or Firm—Pillsbury Winthrop Shaw Pittman LLP (57) ABSTRACT

An electrode assembly (50) and an associated plasma reactor system (10) and related methods for a variety of plasma processing applications. The electrode assembly provides control of a plasma density profile (202) within an interior region (30) of a plasma reactor chamber (20). The electrode assembly includes an upper electrode (54) having a lower surface (54L), an upper surface (54U) and an outer edge (54E). The lower surface of the upper electrode faces interior region of the plasma chamber housing the plasma (200), and thus interfaces with the plasma. The electrode assembly further includes a segmented electrode (60) arranged proximate to and preferably substantially parallel with the upper surface of the upper electrode. The segmented electrode comprises two or more separated electrode segments (62a, 62b, . . . 62n), each having an upper and lower surface. Each electrode segment is spaced apart from the upper electrode upper surface by a corresponding controlled gap (Ga, Gb, . . . Gn). The electrode assembly may further include one or more actuators (110) attached to one or more electrode segments at the upper surface of the one or more electrode segments. The actuators allow for movement of the one or more electrode segments to adjust one or more of the controlled gaps. The adjustable controlled gaps allow for controlling the shape of the plasma density profile within the interior region of the chamber, thereby allowing for a desired plasma process result.

12 Claims, 9 Drawing Sheets

CONTROLLED METHOD FOR SEGMENTED ELECTRODE APPARATUS AND METHOD FOR PLASMA PROCESSING

This is a Divisional application of U.S. Continuation application No. 10/189,425, filed on Jul. 8, 2002 now U.S. Pat. No. 6,863,020, as a Continuation of International Application PTC/US01/00120, filed on Jan. 3, 2001, and claims benefit of U.S. Application No. 60/175,284, filed Jan. 10, 2000, the contents of which are incorporated herein in their entirety by reference.

The present invention relates to plasma processing, and more particularly pertains to electrodes associated with plasma processing apparatus and methods for controlling the plasma.

BACKGROUND OF THE INVENTION

In semiconductor manufacturing, plasma reactor chambers are used to remove or deposit material on a semiconductor substrate in the process of making integrated circuit (IC) devices. A key factor in obtaining the highest yield and overall quality of ICs is the uniformity of the etching and deposition processes.

A problem that has plagued prior art plasma reactors is the control of the plasma to obtain uniform etching and deposition. In plasma reactors, the degree of etch or deposition uniformity is determined by the design of the overall system, and in particular the design of the electrodes used to create the plasma in the interior of the reactor chamber.

Figure 1:
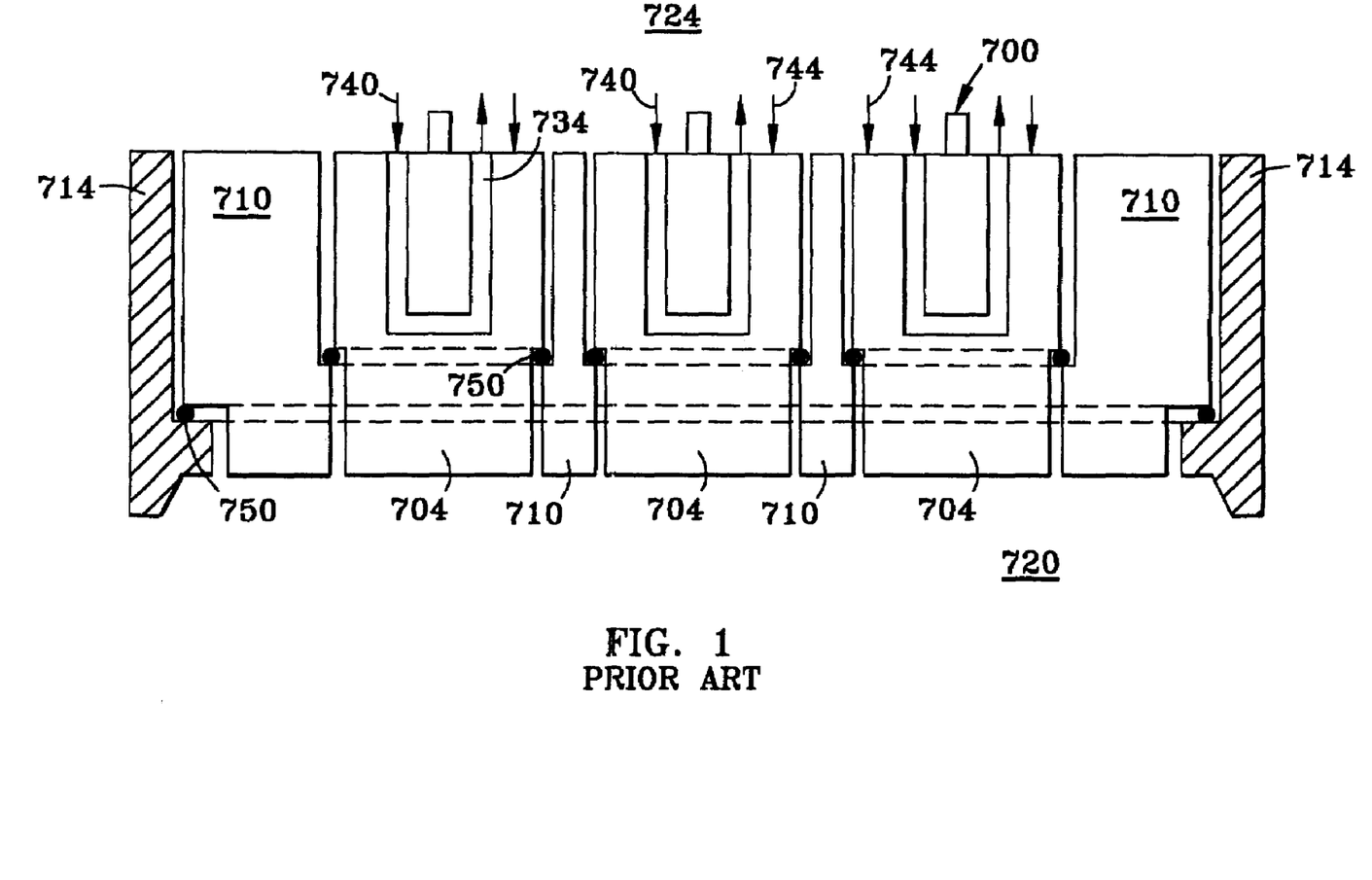
FIG. 1 is a schematic cross-sectional diagram of an exemplary prior art segmented electrode as housed in a plasma reactor chamber.

One approach to improving etch and deposition uniformity has been to use a segmented electrode. An exemplary prior art segmented electrode 700 is shown in FIG. 1. Segmented electrode 700 includes separate thick conducting electrode segments 704 separated by an insulator 710, which is a single-piece shaped like a wheel with a hub, a rim, and spokes, and is housed in a chamber frame 714. The design of segmented electrode 700 is such that electrode segments 704 contact a vacuum region 720 on one side, and atmospheric pressure region 724 on the other side. This puts electrode segments 704 directly in contact with the plasma formed in vacuum region 720. In addition, each segment 704 of segmented electrode 700 has numerous conduits 734 through which a cooling fluid 740 must flow to cool the segments during operation. Further, segmented electrode 700 includes numerous gas feed lines 744 for introducing gas into vacuum region 720. Moreover, numerous seals 750 are required between insulator 710 and electrode segments 704 to isolate vacuum region 720 from atmospheric pressure region 724. The need for multiple gas lines and multiple sets of cooling lines significantly complicates the electrode and chamber design, and makes for a complex plasma reactor apparatus that is more susceptible to failures.

With continuing reference to FIG. 1, insulator 710 serves to separate electrode segments 704 to minimize inter-electrode capacitance and cross talk. Typically, insulator 710 needs to be cut or otherwise formed into a complex shape, which is expensive and difficult to manufacture. In addition, insulator 710 is typically fragile and thus prone to breaking because of the small size of the critical dimensions of the insulator. Even once it has been made, the insulator is prone to cracking because of mechanical stress that builds up at the relatively sharp corners. In addition, despite improvements in plasma uniformity achieved with prior art segmented electrodes, sharp local changes in etch or deposition rate over the wafer, i.e., the "electrode pattern imprint," still occurs.

There are several patents pertaining to segmented electrodes for use in plasma etch apparatus. For example, U.S. Pat. No. 5,733,511, "Power distribution for multiple electrode plasma systems using quarter wavelength transmission lines", (the '511 patent) describes a multiple electrode plasma reactor power splitter and delivery system to provide balanced power to a plurality of powered electrodes by utilizing the properties of quarter wave length transmission lines. Each electrode is supplied power by a separate (2N+1) $\lambda/4$ wavelength cable, where N=0, 1, 2 . . . , connected to a common point at a load match network's output. The impedance transformation properties of these lines are also employed to convert the plasma load to one that is more efficiently matched into by a standard network. Also disclosed is a technique of splitting a single large active electrode into smaller active electrodes powered by the above distribution scheme in order to achieve maximum uniformity of the reactive plasma throughout the working volume. However, a shortcoming of the apparatus described in the '511 patent is that the electrode segments are not driven by separate RF power sources, but the $\lambda/4$ cables are all connected to a common point at the match network output, so that there is no means provided for control of individual segments. Also, according to the Figures in '511 patent, it appears that the segment electrodes are physically separate of each other, like that shown in FIG. 1 herein, which leads to an excessively complex design and susceptibility to failure.

U.S. Pat. No. 4,885,074, "Plasma reactor having segmented electrodes," (the '074 patent) describes a plasma reactor for generating a uniform field of energized gas for plasma processing. A mechanism for mounting a workpiece is disposed within the reactor chamber so that a workpiece can be exposed to energized gas. A first electrode in the chamber is positioned in operative relationship to the workpiece mounting mechanism and a second electrode within the reactor is positioned to at least partially surround the first electrode. However, a shortcoming of the '074 patent is that the segment electrodes are ring shaped and do not provide azimuthal (circumferential) control of uniformity. Accordingly, an off-center peak etch-rate cannot be corrected with the electrode geometry of the '074 patent.

U.S. Pat. No. 5,006,760, "Capacitive Feed for Plasma Reactor," (the '760), describes a capacitive feed for the lower electrode in a parallel plate plasma reactor. One plate of the capacitor comprises the lower electrode or a contact to the lower electrode. The other plate of the capacitor comprises an annular member insulated from the lower electrode, or the contact. There are no RF connections directly to the lower electrode. However, the movable electrode is not segmented and is not for the purpose of altering the plasma density profile to account for etch or deposition non-uniformity.

Accordingly, it would be much preferred to have a way of modifying the plasma density profile in a plasma reactor to achieve an improved etch, deposition or other plasma process uniformity without the design complexities and shortcomings associated with present-day segmented electrodes. In addition, it would be much preferred to have a way of controlling the plasma density profile to achieve a desired effect, even if it means creating a non-uniform plasma density profile. These non-uniform plasma density profiles are often required to accommodate non-uniformity created by previous non-uniform wafer processing steps.

BRIEF SUMMARY OF THE INVENTION

The present invention relates to plasma processing, and more particularly pertains to electrodes associated with plasma processing apparatus and methods for controlling the plasma.

A first aspect of the invention is an electrode assembly for providing a controlled RF electric field profile within a region capable of containing a plasma. The electrode assembly comprises an upper electrode having a lower surface, an upper surface and an outer edge. The region capable of supporting a plasma is adjacent the upper electrode lower surface. A segmented electrode is arranged proximate to and substantially parallel with the upper electrode upper surface, and comprises two or more separate electrode segments each having an upper and lower surface. Each electrode segment is spaced apart from the upper electrode upper surface by a corresponding controlled gap.

A second aspect of the invention is the electrode assembly as described above, further including one or more actuators attached to one or more of the electrode segments at their upper surface. The actuators are for moving the one or more electrode segments to adjust one or more of the controlled gaps, thereby affecting the RF electric field and plasma density profiles in the interior region containing the plasma on the opposite side of the upper electrode. The actuators are preferably electronic in nature, and are electronically connected to an actuator control system. Two or more electrode segment RF power supply systems are electronically connected to the respective two or more electrode segments through respective two or more electrode segment RF feeds. The system also includes a main RF power supply system electronically connected to the upper electrode through a main RF feed. Further included in the system is a main control system which controls the RF power supply systems, the actuator control system, and other subsystems of the plasma processing system. The main control system receives system operating parameters via a plurality of sense lines, for example, a chamber pressure sense line, a coolant temperature sense line, RF powers sense lines, impedance sense lines, etc. Also included is a database, electronically connected to the main control system, containing information pertaining to a plurality of system operating parameter values corresponding to a variety of plasma density profiles.

A third aspect of the invention is an electrode assembly according to either the first or second aspect of the invention described above, further including first corrugations and first spaces on the lower surfaces of the electrode segments, and second corrugations and second spaces on the upper surface of the upper electrode, wherein the first corrugations are aligned with the second spaces.

A fourth aspect of the invention is a plasma reactor system comprising a plasma chamber having a lower wall and sidewalls, and a substrate support member having a support surface for supporting a substrate, the latter arranged adjacent the lower wall. The plasma reactor system further includes an electrode assembly according to either the second or third aspect of the invention, as described briefly above, arranged adjacent the substrate support member and within the chamber sidewalls such that the lower surface of the upper electrode and the substrate surface are substantially parallel and form, in combination with the chamber sidewalls, an interior region capable of containing a plasma.

A fifth aspect of the invention is a method of adjusting the plasma density profile of a plasma contained in an interior region of a plasma reactor, so as to cause the plasma density profile to match or approach a desired plasma density profile. The method includes the steps of first, providing, adjacent the interior region, an electrode assembly according to the second aspect of the invention, as described above, with the upper electrode lower surface facing the interior region. The next step is operating the plasma reactor and creating a database comprising information relating to a plurality of parameters associated with a plurality of operating conditions corresponding to a plurality of different plasma density profiles. The next step is then determining the etch or deposition rate profiles by operating the plasma reactor to expose a substrate to the plasma and measuring the effect of the plasma on the substrate. The next step then involves using the database mentioned above and comparing the determined etch or deposition rate profiles to the desired etch or deposition rate profiles. The final step is then altering the determined etch or deposition rate profile to approach the desired etch or deposition rate profile by moving one or more electrode segments.

A sixth aspect of the invention is a method of processing a substrate with a plasma having a density profile approaching a desired plasma density profile. The method includes the steps of first, providing the plasma reactor chamber as described above in connection with the plasma reactor system of the fourth aspect of the invention. The next step involves providing one or more plasma gases into the interior region. The next step is then providing RF power to the upper electrode and to the two or more electrode segments so as to form in the interior region a plasma having an associated first plasma density profile. The next step is measuring the first plasma density profile. This can be done, for example, by exposing a blanket wafer to the plasma and measuring the effect, for example etch or deposition rate. The next step is adjusting one or more of the two or more electrode segments relative to the upper electrode so as to alter the plasma density profile to form a second plasma density profile that matches or approaches the desired plasma density profile. Once the plasma profile is so adjusted, the next step involves placing a substrate in the interior region onto the substrate support member. The final step is then processing the substrate with the second (i.e., adjusted) plasma density profile to produce the desired effect on the substrate.

DETAILED DESCRIPTION OF THE INVENTION

The present invention relates to plasma processing, and more particularly pertains to electrodes associated with plasma processing apparatus and methods for controlling the plasma.

In the present specification, the terms "profile" and "distribution" are used interchangeably, since they are the same and mean distribution of the plasma density or plasma process rate over the substrate (wafer) surface. Further, it will be apparent to one skilled in the art that the present invention is applicable to a variety of plasma processes, including etch and deposition.

Plasma Reactor Apparatus

Figure 2:
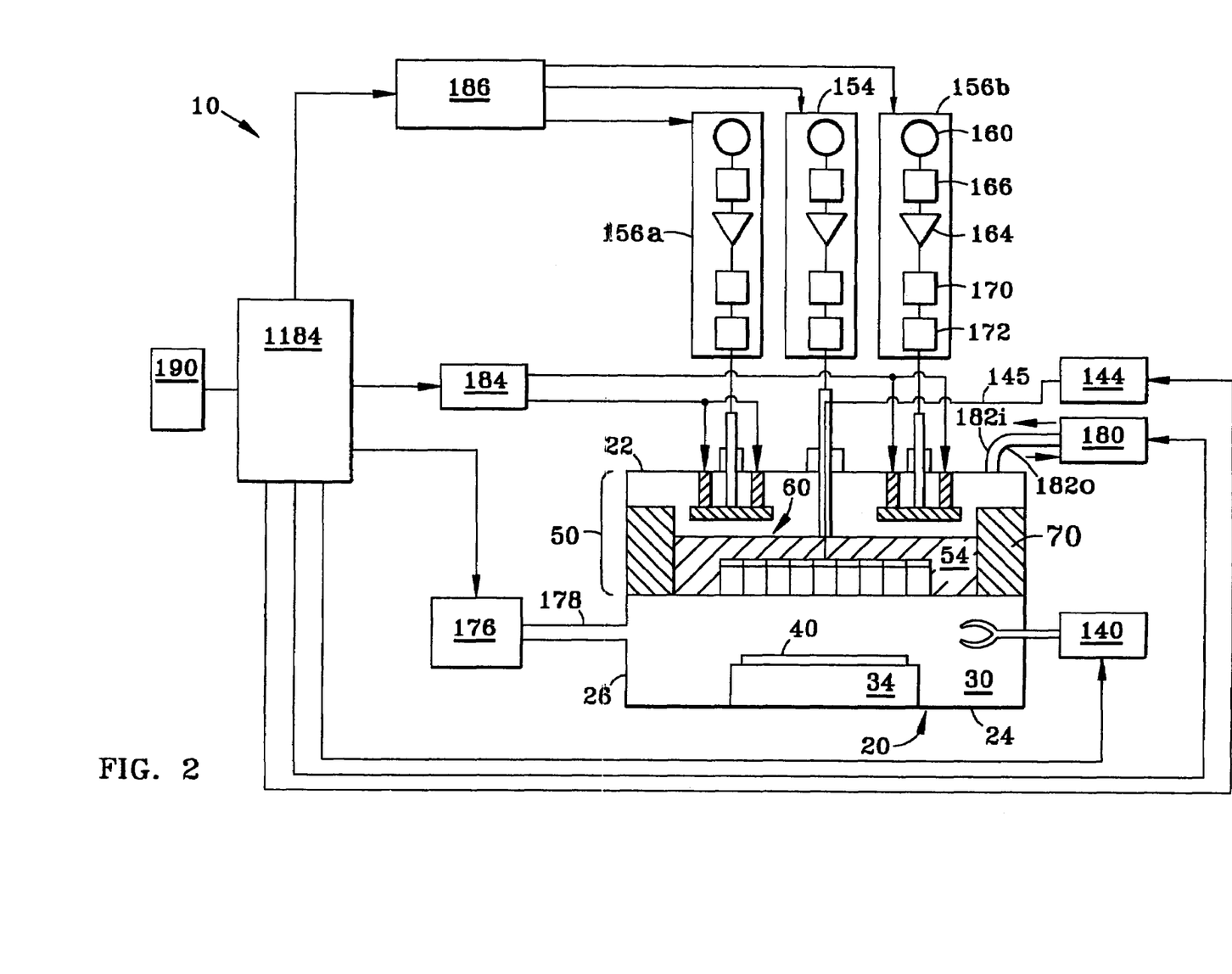
FIG. 2 is a schematic diagram of the plasma reactor system 10 according to the present invention.
Figure 3:
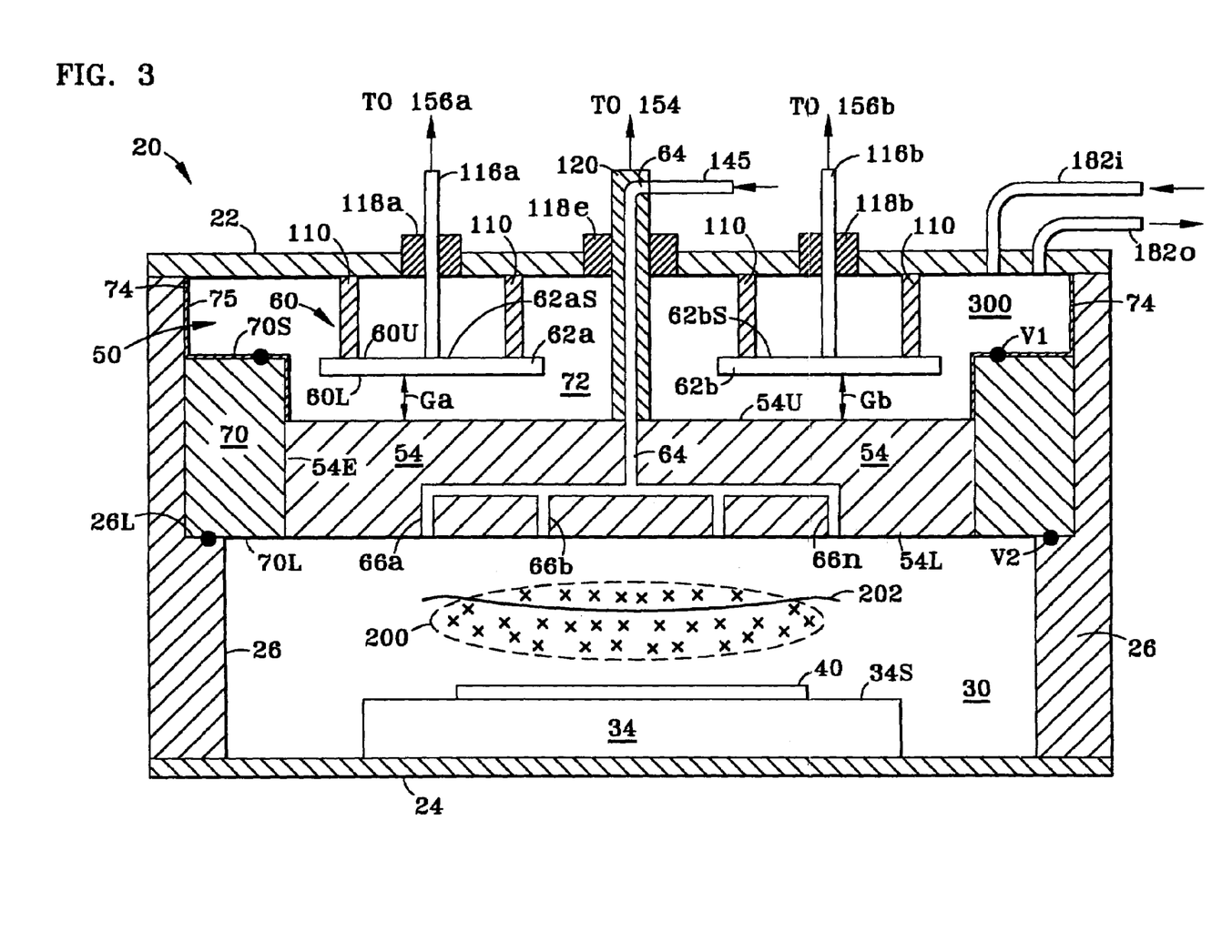
FIG. 3 is a cross-sectional schematic diagram of the reactor chamber of FIG. 2.
Figure 4A:
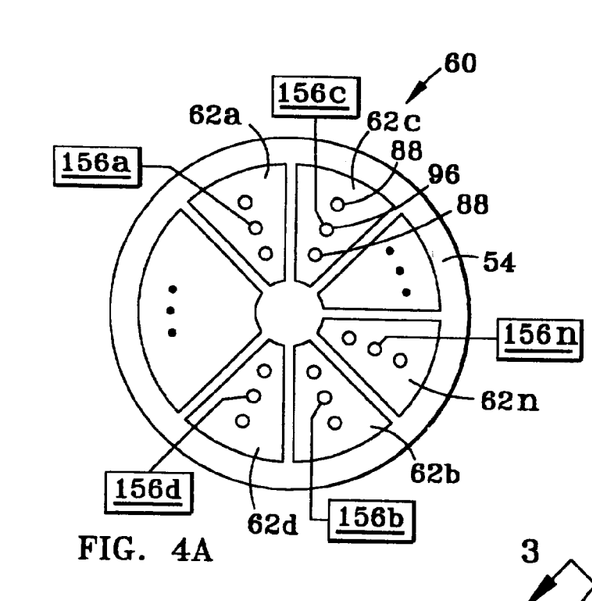
FIG. 4A is a plan view of a generalized segmented electrode of the present invention with the upper electrode underneath, the electrode having n electrode segments and n RF power supply systems connected to respective electrode segments.
Figure 4B:
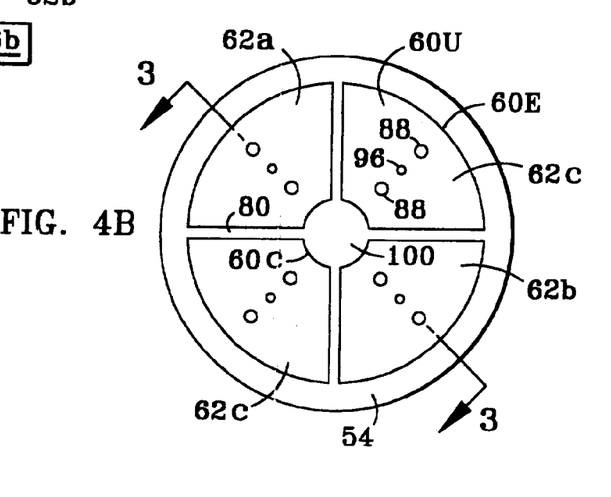
FIG. 4B is a plan view of the segmented electrode according to a first embodiment of the present invention with the upper electrode underneath, wherein the segmented electrode is similar to that shown in FIG. 4A and has four symmetrically arranged electrode segments.
Figure 4C:
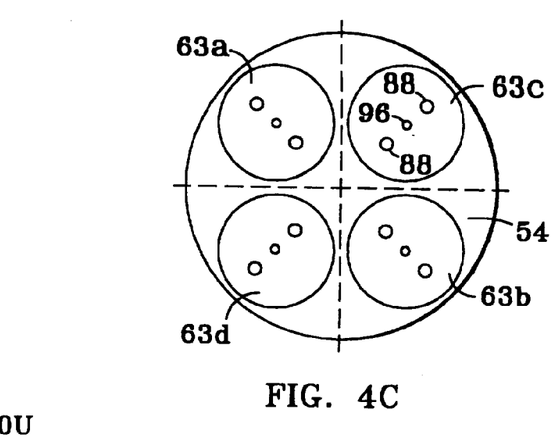
FIG. 4C is a plan view of an alternate embodiment of the segmented electrode according to the present invention with the upper electrode underneath, wherein the electrode segments are circular.

With reference now to FIGS. 2–4, plasma reactor system 10 of the present invention comprises a plasma chamber 20 with an upper wall 22, a lower wall 24, side walls 26 and an interior region 30 capable of containing a plasma. System 10 further includes within interior 30 of chamber 20 adjacent lower wall 24 a substrate support member 34 with a support surface 34S for supporting a substrate 40. Support member 34 serves as a lower electrode. System 10 also includes, within chamber 20 adjacent upper wall 22, an electrode assembly 50 comprising a unitary upper electrode 54 having an upper surface 54U and a lower surface 54L, and a segmented electrode 60 having an upper surface 60U, a lower surface 60L, a center edge 60C and an outer edge 60E. Segmented electrode 60 comprises two or more electrode segments 62a, 62b, . . . 62n, as shown in FIG. 4A, one or more of which are, in a preferred embodiment, independently movable. Electrode segments 62a, 62b, . . . 62n are preferably planar or substantially so.

For ease of illustration and discussion, only four wedge-shaped electrode segments 62a–62d are shown in FIG. 4B, and only two electrode segments 62a and 62b are visible in the cross-sections of FIGS. 2 and 3. However, it will be understood by those skilled in the art that other shapes for electrode segments 62a, 62b, . . . 62n are possible, such as circular electrode segments 63a–63d (FIG. 4C). The particular shape of the electrode segments and the number of segments will depend on the desired form of the RF electric field formed in interior region 30, and the required capacitive coupling area. Because of the complex nature of the fields associated with plasma processing apparatus such as system 10, the optimum number, shape and arrangement of electrode segments to produce a given field may best be deduced empirically or through computer simulation.

With reference again to FIG. 3, upper electrode 54 preferably comprises a metal such as aluminum or other known suitable conducting electrode material. Upper electrode 54 includes a central gas conduit 64 open to upper surface 54U, and which preferably branches into a plurality of gas conduits 66a, 66b, . . . 66n, each open to lower surface 54L and leading to interior 30. Also, electrode segments 62a–62d have upper surfaces 62aS–62dS, respectively.

An insulator ring 70 surrounds outer edge 54E of upper electrode 54. Ring 70 may extend all the way up to upper wall 22, and not need be level with surfaces 60U or any other surface. Lower surface 70L of insulator ring 70 preferably rests on a ledge 26L formed on the interior of side wall 26, as shown. Insulator ring 70 is made of an insulating material such as ceramic, and electrically isolates upper electrode 54 from wall 26. Upper electrode 54 and electrode segments 62a–62d are spaced apart by controlled gaps Ga–Gd, respectively (only gaps Ga and Gb are shown FIG. 3 in cross-section). Gaps Ga–Gd are nominally 1 mm, but in a preferred embodiment are variable between 0.1 to 25 millimeters through the use of actuators 110, discussed in greater detail below, which move one or more of the electrode segments relative to the upper electrode. The lower limit on the size of gaps Ga–Gd is determined by the dielectric breakdown of the cooling fluid within the gaps. Because controlled gaps Ga–Gd are small as compared to the surface area of upper electrode 54 and segmented electrode 60, the two electrodes are capacitively coupled.

An electrode chamber 72 is defined by upper surface 54U of upper electrode 54, insulator ring 70, chamber side walls 26, and chamber upper wall 22. With reference to FIG. 3, a preferred embodiment for electrode assembly 50 includes a modular housing 74 consisted of dielectric side walls 75 adjacent chamber wall 26, upper wall 22, and upper electrode 54, within which the electrode assembly is enclosed. Lower surface 54L of upper electrode 54 is exposed to interior region 30. As discussed in greater detail below, chamber 72 serves to contain a cooling fluid that circulates around electrode segments 62a–62d, atop upper electrode 54, and also in between controlled gaps Ga–Gd. Modular housing 74 allows the containment of cooling fluid at all times, which allows the entire module to be easily replaced without flushing the system of cooling fluid, for easy maintenance.

The Segmented Electrode

With reference to FIG. 4B, segmented electrode 60 includes four wedge-shaped segments 62a–62d, though, as discussed above, either more or fewer such segments, as well as differently shaped segments, could be used equally advantageously, as shown in FIGS. 4A and 4C. Segments 62a–62d are separated from each other by a space 80 sufficient to substantially electrically isolate the segments from one another.

In FIG. 4B, cross-section 3—3 coincides with the cross sectional view of segmented electrode 60 shown in FIG. 3. Segmented electrode 60 also preferably includes actuator sites 88 for receiving actuators 110 (discussed below) in attaching the actuators to electrode segments 62a–62d. Two actuator sites per electrode segment are shown, but three or more such sites could be used, depending on the number of actuators employed. Each electrode segment 62a–62d includes a single contact 96 for an RF electrode segment feed (discussed below) for driving the electrode segment. A main RF feed (also discussed below) passes from outside chamber 20 to upper electrode 54 through a center clearance 100 of segmented electrode 60, with electrode segments 62a–62d being arranged around this center.

With reference again to FIGS. 2 and 3, system 10 further includes actuators 110, such as piezoelectric transducers, fine lead screws, magnetostrictive devices, voice-coils, and the like. One end of each actuator 110 is connected to the upper surface 62aS–62dS of a respective one of electrode segments 62a–62d at a respective actuator site 88 (FIGS. 4A–4C). The opposite end of each actuator 110 is attached to upper wall 22 of electrode chamber 72. Actuators 110 cause the particular electrode segment or segments to move relative to upper electrode 54. In this manner, one or more of controlled gaps Ga–Gd can be made smaller or larger, thus affecting the form of the RF electric field in interior region 30.

In addition, system 10 includes electrode segment RF feeds 116a–116d which pass through coax insulators 118a–118d formed in upper wall 22 of electrode chamber 72 and are connected to upper surfaces 62aS–62dS at contacts 96. Likewise, main RF feed 120 passes through a coax insulator 118e in upper wall 22 of chamber 72, and is connected to upper electrode 54. RF feed 120 has a central gas conduit 64 formed inside it so that gas can flow from a gas source located outside chamber 30 through the central gas conduit of upper electrode 54 and into chamber interior 30. RF feeds 116a–d and 126 are preferably round rod-shaped and fairly thick (5 to 25 mm). These feeds are surrounded by coax insulators 118a–e, which extend to the underside of upper wall 22.

With continuing reference to FIG. 2, system 10 further includes a wafer handling system and robotics system 140 in operative communication with plasma chamber 20, for placing and removing substrates (i.e., wafers 40) onto and from substrate support member 34. Also included is a gas supply system 144 in pneumatic communication with chamber 20 via a gas supply line 145 connected to central gas conduit 64, for supplying gas to chamber interior 30 to purge the chamber and to create the plasma. The particular gases included in gas supply system 144 depend on the application. However, for plasma etching applications, gas supply system 144 includes such gases as chlorine, hydrogen-bromide, octafluorocyclobutane, and various other fluorocarbon compounds, etc., and for chemical vapor deposition applications, includes silane, ammonia, tungsten-tetrachloride, titanium-tetrachloride, and the like.

System 10 also includes an RF power supply system 154 electronically connected to upper electrode 54 via main RF feed 120. Also included in system 10 are RF power supply systems 156a–156d electronically connected to electrode segments 62a–62d through electrode segment RF feeds 116a–116d. Each of RF power supplies 154 and 156a–156dcomprise a signal generator 160, a gain stage (amplifier) 164, a phase shifter 166, a match network 170, and a bandpass filter 172. Match network 170 comprises electronic circuitry that matches the output impedance of gain stage 164 (which is typically at 50Ω) to the load impedance of the plasma and electrodes (which are typically in the range of 1–10Ω). The bandpass filter 172 is set to pass the frequency of the RF drive signal of its associated segment electrode which, in conjunction with match network 170, prevents power from other segments operating at different frequencies to be coupled back into said RF power supply systems 154 or 156a–156d.

Further included in system 10 is a vacuum system 176 in pneumatic communication with chamber 20 via a vacuum line 178. Also included is a cooling system 180 in fluid communication with electrode chamber 72 through chamber upper wall 22 via an input fluid line 182i and an output fluid line 182o, for circulating cooling fluid 300 into and out of the electrode chamber.

System 10 also includes an actuator control system 184 in operative communication with actuators 110, for activating the actuators. In a preferred embodiment, actuators 110 are electronic (e.g., piezoelectric transducers), in which case actuator control system 184 is electrically connected to the actuators and actuates the actuators by an electronic signal. Actuator control system 184 is in operative communication with a main control system 1184, discussed in greater detail below.

System 10 further includes a RF control system 186 in electronic communication with RF power supply systems 154 and 156a–156d, which is also in communication with main control system 1184. Main control system 1184 is also responsible for control of the gas supply system 144, vacuum system 176, wafer handling system 140, and cooling system 180. By controlling systems/controllers 144, 140, 180, 186, 184, 176, and numerous others not shown, main control system 1184 controls the plasma processing of substrates 40 using system 10, as described below. An exemplary main control system 1184 is a computer having a memory unit and a processor, such as a PENTIUM™, processor, as well as data acquisition and control capability. A suitable computer for control system 184 is a DELL PRECISION WORKSTATION 610™, available from Dell Corporation, Dallas, Tex.

Operation of the Plasma Reactor System

With continuing reference to FIGS. 2 and 3, the operation of plasma reactor system 10 is now described.

First, since the response of the plasma formed in interior region 30 to the field formed by electrode assembly 50 is non-linear, the process of using main control system 1184 to operate system 10 to achieve a desired plasma processing result preferably includes completing a design of experiments (DOE) set of tests from which a database 190, in electronic communication with main control system 1184, is created. The DOE process is performed for a plurality of operating parameters, such as temperature T of cooling fluid 300, pressure P of interior region 30, the amount of RF power supplied to each electrode segment 62a–62d and upper electrode 54, etc., over a range of operating conditions. The DOE process needs to be repeated if there are significant changes in the design of system 10. For example, if the number and/or shape of electrode segments 62a–62d are changed to accommodate different process requirements, the DOE process should be redone The DOE process may include, for example, etching a set of bare (i.e. blanket) substrates, such as silicon wafers, under a variety of different etching conditions, including various settings of control gaps Ga–Gd, output powers of RF power supply systems 154 and 156a–156d, and so on. Likewise, plasma deposition on bare substrates may also be performed. The topography of each substrate is then measured using known techniques. Substrate topography provides an indication of the uniformity of the etch or deposition, which in turn, provides an indication of the uniformity of the plasma density profile, which is directly indicative of the RF electric field profile. This empirical information may be stored in database 190 as a look-up table.

Database 190 may be stored in computer memory (which may be a part of main control system 1184), and can be accessed through or by main control system 1184 to provide data, such as described immediately above, that allows for the optimum parameter setting.

A predetermined set of instructions (e.g., a computer program) is first loaded and stored in main control system 1184, which implements a user-defined recipe for plasma processing of substrate 40. Next, control system 1184 sends a first electronic signal to wafer handling system 140 to initiate the loading and unloading of a substrate (wafer) 40 to and from substrate support member 34. Substrate 40 serves as a lower electrode with respect to electrode assembly 50. Control system 1184 then sends a second electronic signal to gas supply system 144 to initiate purging of plasma chamber 20 with a purge gas (e.g. nitrogen) from gas supply system 144. Next, control system 1184 generates a third electronic signal to vacuum system 176 to maintain a predetermined pressure in plasma chamber 20. Typical operating pressures in chamber 20 range from 1 to 100 mTorr, but may also significantly deviate from this range, depending on the plasma process.

In the next step in the operation, control system 1184 sends a fourth electronic signal to gas supply system 144 to regulate the flow of gases from which a suitable plasma may be formed, such as those gases mentioned above, from gas supply system to plasma chamber 20. Next, control system 1184 sends fifth through eighth electronic signal to RF power supply systems 156a–156d, respectively, to provide RF power to electrode segments 60a–60d of segmented electrode 60. Next, control system 1184 sends a ninth electronic signal to RF power supply system 154 to provide RF power to upper electrode 54. This forms a plasma 200 within interior 30 of plasma chamber 20. The spatial distribution of the RF electric field in plasma 200 depends on the capacitive coupling of the RF electric fields from segment electrodes 62a–62d to upper electrode 54, and then from upper electrode 54 to the plasma 200. The preferred frequency for RF power supply system 154 driving upper electrode 54 is 60 MHz, but the invention will work well at other frequencies, particularly higher ones. The driving frequency of segment electrodes 62a–62d is also preferably in the megahertz range, but need not the same as that of upper electrode 54, nor need be a harmonic of the upper electrode RF frequency.

In the next step of the operation, based on information in database 190, control system 1184 sends a tenth electronic signal to actuator control system 184 to activate actuators 110 to adjust control gaps Ga–Gd to obtain a plasma density profile 202 that matches, or at least approaches, a desired plasma density profile. The desired plasma density profile may be a uniform profile, or a non-uniform profile that provides a particular plasma processing characteristic, for example etch or deposition characteristic. The desired profile may be predetermined as an idealized one, or may be chosen from one of the plasma density profiles available based on the available operating conditions using information stored in database 190. Unlike the prior art segmented electrode 700 of FIG. 1, the present electrode assembly controls the field in region 30 from upper surface 54U of upper electrode 54, rather than at a surface in contact with the plasma, so that electrode segments 62a–62d are not directly exposed to plasma 200.

In arriving at forming a plasma density profile that approaches or matches a desired plasma density profile, it may be preferred, or even necessary, to process a test substrate, or multiple substrates, in the manner described above in forming database 190, to determine the state of the plasma. Once the state of the plasma is assessed through measuring the resultant test substrate or substrates, this state can be identified in database 190. This then provides direction as to setting the operating parameters of system 10 so that this measured plasma density profile is altered to match or approach the desired plasma density profile. In this case, after the test substrate or substrates are processed and evaluated, the above steps are repeated in processing the substrate to be processed with the newly formed plasma density profile.

In the next step, control system 1184 sends an eleventh electronic signal to cooling system 180 so that the flow of cooling fluid through electrode chamber 72 is adjusted to maintain electrode assembly 50 at a controlled temperature during operation when processing the substrate.

When processing of substrate 40 is complete, control system 1184 sends a twelfth electronic signal to vacuum system 176, which adjusts the pressure of chamber 20 to a setting where wafer unloading is done. Finally, control system 1184 sends a thirteenth electronic signal to wafer handling system 140, which removes substrate 40 from reactor chamber 20.

Purpose of an Electrode Assembly with a Segmented Electrode

The purpose of segmented electrode 60 in electrode assembly 50 of the present invention is to allow for compensation of RF field non-uniformities in interior region 30 due to the RF signal driving upper electrode 54. Such field non-uniformities result in plasma density profile non-uniformities, which result in etch, deposition, or other plasma process non-uniformities. RF field compensation is accomplished in the present invention by having a segmented electrode with, in a preferred embodiment, variable spacing with respect to an upper electrode that interfaces with the plasma.

Figure 5:
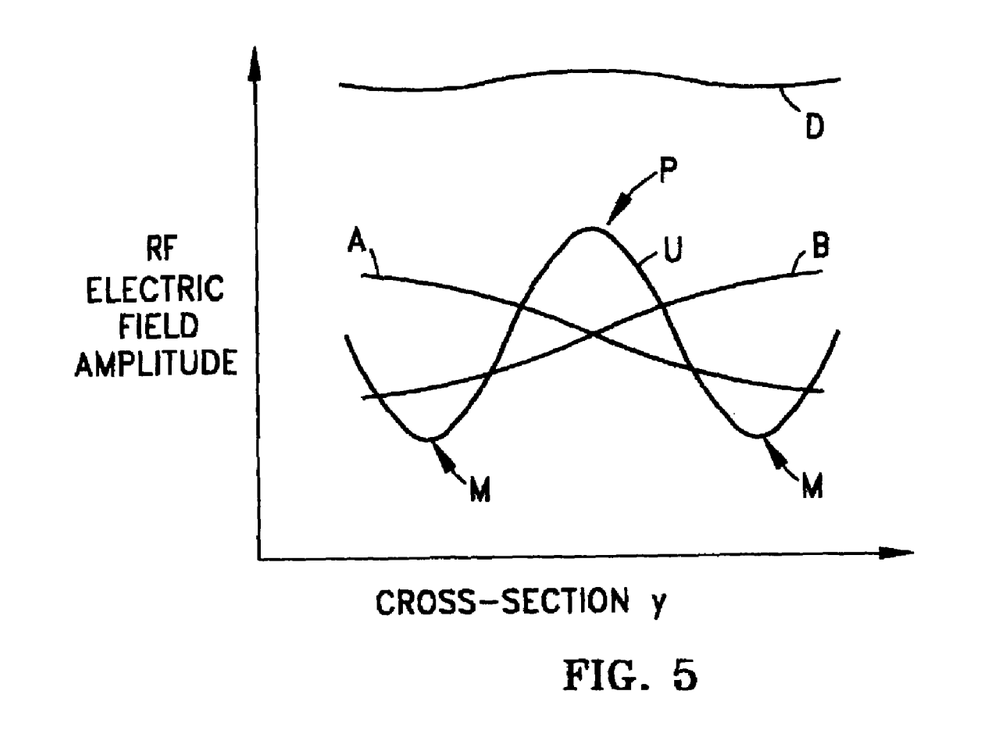
FIG. 5 is a schematic plot of exemplary RF electric field components perpendicular to the substrate surface, taken across the substrate surface (i.e., along the substrate diameter) as an illustration of a possible field non-uniformity created by the electrode assembly of FIG. 2, wherein U is the electric field due to the upper electrode alone, A is the electric field due to one of the electrode segments, B is the electric field due to an electrode segment opposite the aforementioned electrode segment, and D is the combined electric field due to the upper electrode and the electrode segments.

With reference now to FIG. 5, RF electric field U due to upper electrode 54 determines the basic shape of the field. However, RF electric field U may be non-uniform and have, for example, a peak P in the middle, and dips (minima) M on either side of the peak.

Segmented electrode 60 of the present invention compensates for deviations in RF electric field uniformity, producing either a uniform (i.e., "flat") field, or a field of a given shape. Since each of electrode segments 62a–62d (or, more generally, segments 62a–62n, as shown in FIG. 4A) resides above only a portion of substrate 40, each segment generates a field that primarily affects only a portion of the substrate. Thus, for example, using an electrode 60 shaped as in FIG. 4B, each of electrode segments 62a–62d produces a RF electric field (e.g., electric fields A, B, associated with electrode segments 62a, 62b, in FIG. 5) with a relatively broad peak underneath the electrode in a region above substrate 40 located to one side of the vertical center line of electrode 60. This electric field contributes relatively little to the field in a region above substrate 40 located at the opposite side of that center line. Use of symmetrically arranged electrode segments allows the broad peak from each electrode segment to be aligned with both of side dips M of field U from upper electrode 54. The combined RF electric field D from all of electrode segments, including upper electrode 54, is relatively smooth, and significantly smoother than any of the individual RF electric fields U, A or B, for example. Likewise, the corresponding RF magnetic field is smoother, and hence the plasma density profile is smoother.

Segmented electrode 60 of the present invention has the capability to adjust the form of the RF electric field azimuthally as well as radially. Prior art segmented electrodes are typically made as concentric rings, which allow for only radial changes in the field. In the present design, correction of azimuthal field non-uniformity can be made by asymmetrically powering certain of electrode segments 62a–62d on opposite sides of segmented electrode 60 (FIG. 3B). Further, creation of field non-uniformity (either axisymmetric or non-axisymmetric) to achieve a desired etch, deposit or other plasma processing effect can be achieved by appropriately powering certain of the electrode segments.

In a preferred embodiment of the present invention, the RF frequency at which electrode segments 62a, 62b . . . 62n (FIG. 4A) are driven is fixed. However, the amplitude and the phase of the drive frequency for each electrode segment can be independently controlled by adjusting electrode segment RF power supply systems 156a, 156b, . . . 156n via electronic signals from control systems 1184 and 186. Consequently, the amplitude of the peak fields due to electrode segments 62a, 62b . . . 62n can be tuned to provide the desired RF electric field characteristics to achieve optimum etching, deposition, or other plasma processing performance.

Changing the location of a peak in the RF electric field of a segment electrode requires frequency control. Phase and amplitude control provide peak amplitude field control. The amplitude and phase of the RF power provided to electrode segments 62a, 62b, . . . 62n by electrode segment RF power supply systems 156a, 156b, . . . 156n can be adjusted to create a non-uniform RF electric field. Such a field would be desirable in order to compensate for existing center-to-edge and/or azimuthal non-uniformities on the substrate arising from previous process steps. Accordingly, the present invention is capable of providing control over the shape of the RF electric field to improve uniformity, or to shape the field for a particular purpose, whichever is needed.

Frequency control of RF power supply systems 156a, 156b, . . 156n in electronic communication with electrode segments 62a, 62b, . . . 62n allows the radial position of the peak location of segment electrode fields to be adjusted. Using a higher frequency also provides a sharper electrode segment field peak. A frequency sweep may also be used to broaden the field peak by moving the peak radially in time during processing.

In the prior art, tunable output capacitors inside a match network are typically used to provide essential tuning capability so that the system can be properly impedance matched. In the present invention, such output tunable capacitors need not be part of match network 170 in the above-described embodiment because their role may be taken over by segment electrodes and by controlling the degree of capacitive coupling in gaps Ga–Gd using actuators 110.

Cooling System

In conventional plasma reactors, there is a cavity inside the upper electrode that is filled with a fluid. The purpose of this fluid is to cool the electrode by circulating the fluid within the cavity. However, in the present invention, cooling fluid 300 (FIG. 3) is circulated in electrode chamber 72 atop upper surface 54U of upper electrode 54. This allows upper electrode 54 to be much thinner, since there is no need for a cooling cavity within the upper electrode itself. Since cooling fluid 300 is flowed in controlled gaps Ga–Gd between electrode segments 62a–62d and upper surface 54U of upper electrode 54, the cooling fluid must be a dielectric. Fluid 300 thus also serves as a dielectric in the capacitors formed by electrode segments 62a–62d and upper electrode 54. In the present invention, cooling fluid is a liquid dielectric, such as a perfluorocarbon, e.g. 3M FC84, Galden HT 135, and the like.

The use of a liquid dielectric for cooling fluid 300 and circulating the cooling fluid over upper surface 54U of upper electrode 54 allows the thickness of the upper electrode to be reduced by approximately 50%, to about 20 millimeters, or to whatever minimum thickness required to accommodate the gas distribution channels 64 and 66a–66n within the electrode. This greatly simplifies the design, manufacturing, assembly and maintenance of electrode assembly 50. This thickness reduction in upper electrode 54 also allows lower surface 54L of upper electrode 54 exposed to plasma 200 to be adequately cooled, despite the lack of cooling channels in the upper electrode itself. Also, since electrode segments 62a–62d are immersed in cooling fluid 300, there is no need for cooling lines and gas lines formed within the electrode segments. This allows the electrode segments to be made very thin (e.g., several millimeters), making it easier to cool them.

Actuator Control System

Figure 6:
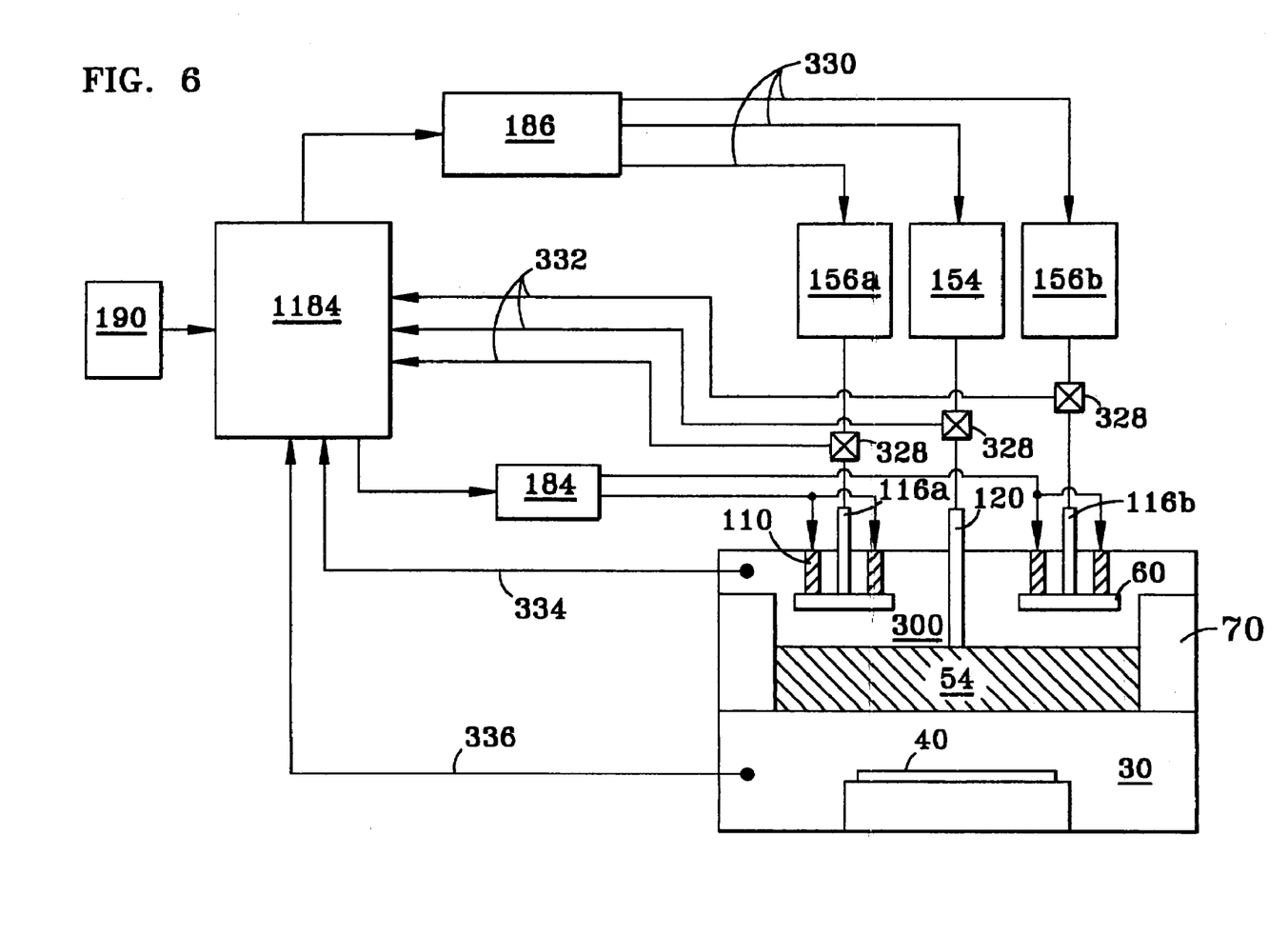
FIG. 6 is a first schematic diagram of the control system and plasma reactor chamber according to the present invention.

With reference now to FIG. 6, actuator control system 184 in electronic communication with actuators 110 can be operated in an open loop manner, but is preferably operated in a closed loop fashion, via the main control system 1184. This is because the dielectric properties of cooling fluid 300 exhibit a slight temperature dependence, and because of the general variability of all other operating parameters of system 10. Accordingly, it is desirable to automatically compensate for the changes in the coupling impedance due to changes in temperature of cooling fluid 300 and other changes in system 10. This capability is also especially important since the properties of cooling fluid 300 change over time. Cooling fluid 300 needs to be periodically replaced, and the replacement cooling fluid may not have the exact same dielectric properties as the original.

Main control system 1184 and actuator control system 184 can compensate for changes in the properties of cooling fluid 300 by changing the size of control gaps Ga–Gd. Furthermore, electrode segments 62a–62d act as controlled capacitors and may be involved in impedance matching of RF power supply systems 154 and 156a, 156b to the plasma load, as discussed above. Accordingly, electrode segments 62a–62d need to be controlled in a loop based on RF power delivered to the plasma load and plasma load impedance measurements on RF feed lines 116a–116d and 120, and other parameters such as chamber pressure, dielectric coolant fluid temperature, etc.

The RF power delivered by RF power supply systems 154 and 156a–156d is sensed by conventional RF power and impedance sensors 328 mounted on RF feeds 120 and 116a–116d, respectively. RF power and impedance measurements are fed via signal lines 332 to main control system 1184. Also, main control system 1184 is fed information, in the form of electronic signals, about chamber pressure via sensor and signal line 336, and dielectric cooling liquid temperature via sensor and signal line 334. These signals, and others not shown in FIG. 6, are compared by main control system 1184 to operating parameter set-points determined for the plasma process being performed (e.g. via DOE explained previously, and stored in database 190), and control signals are issued to the various control subsystems if a discrepancy is being detected. In this manner, closed loop control is carried out.

Among the subsystems being controlled by main control system 1184 is RF control system 186, which in turn controls the RF power output and phase of RF power supply systems 154 and 156a–156d. The control of power output is achieved by adjusting the gain of RF amplifier 164 included in each RF power supply system 154 and 156a–156d, while the phase is controlled by adjusting the setting of phase shifter 166 (e.g. see FIG. 2). In the case of a variable frequency supply (e.g. for moving the RF electric field peaks as explained before), main control system 1184 also controls the frequency by setting the RF frequency of signal generator 160. Also controlled is the capacitive coupling from segment electrodes 62a–62d to upper electrode 54 via actuator control system 184 and electrode actuators 110. Actuators 110 act to control gaps Ga–Gd between the segment and upper electrodes. Two or more actuators 110 associated with the same electrode segment 62a–62d may be controlled by a signal supplied by a single control signal line 326 so that they are being actuated simultaneously and both displace their associated electrode segment by the same distance of travel (i.e. the segment electrodes remain parallel to the upper electrode 54). Alternatively, each of the two actuators associated with the same electrode segment may be controlled by a signal supplied by a separate control line 326. This will allow the two actuators to displace their associated electrode segment by different distances of travel, allowing each electrode segment to be inclined to the horizontal and thus providing an additional capacitive coupling control variable.

Figure 7:
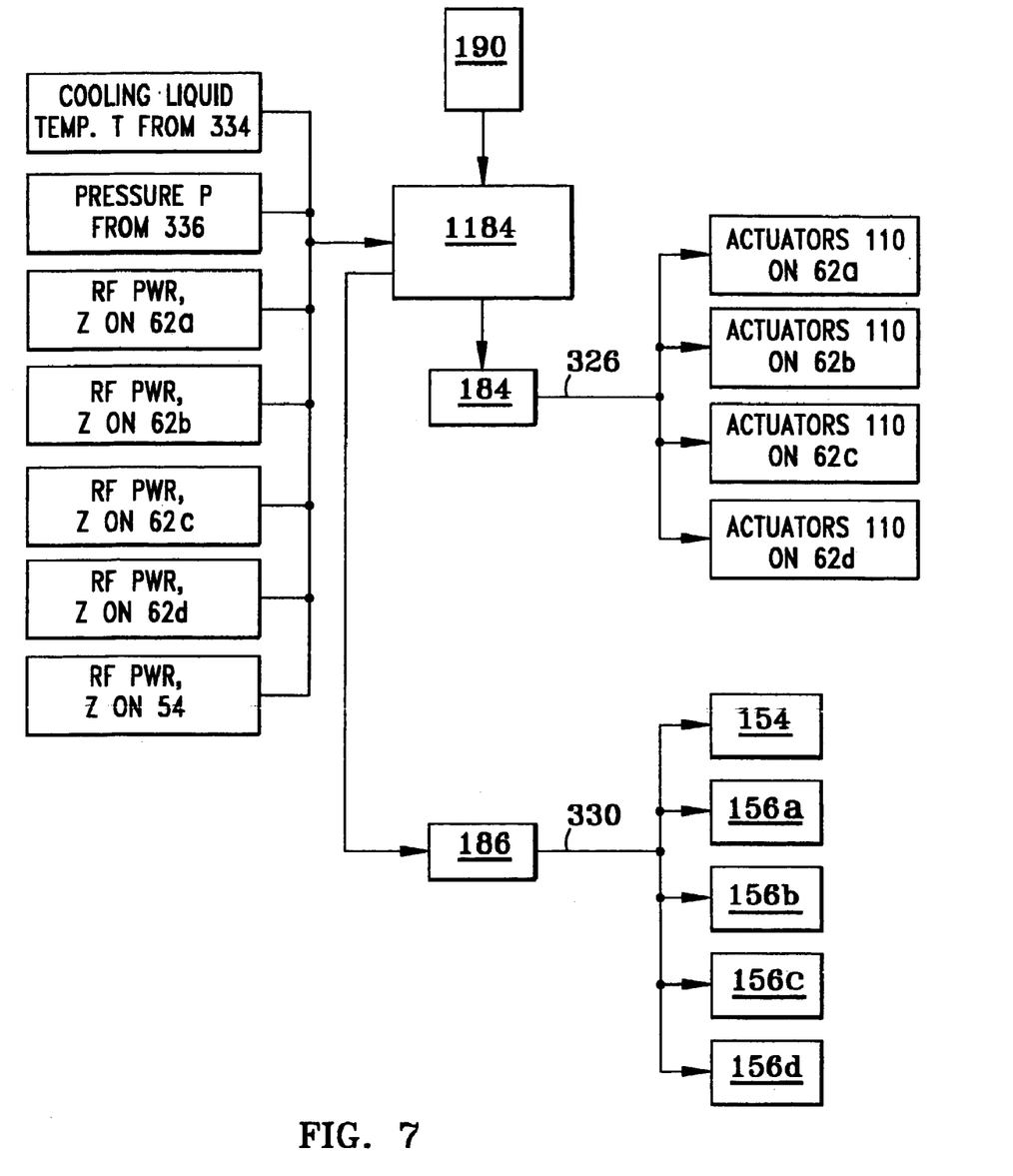
FIG. 7 is a second block schematic diagram of the control system according to the present invention showing the various inputs and outputs of the control system.

With reference to FIG. 7, a second block schematic diagram of actuator control system for the actuators is shown, wherein T=temperature, Z=impedance, RF PWR=RF power, and P=pressure. As described above in connection with the operation of system 10, the operation of actuator control system relies on information from design experiments stored as data in database 190.

Accordingly, with continuing reference to FIG. 7 and also again to FIG. 6, in operation, the process of controlling actuators 110 includes the steps of: (1) sensing the dielectric cooling liquid 300 temperature T, and pressure P of chamber 20, and sending this information via first and second electronic signals to the main control system 1184; (2) sensing the plasma load impedance Z, and delivered RF power RF PWR of the RF signal at each of electrode segments 62a–62d and upper electrode 54, and sending this information in the form of additional electronic signals to the main control system 1184; (3) looking up the appropriate response in database 190, based on parameters determined for the process being run; and (4) adjusting actuators 110 via electronic signals from actuator control system 184 (or alternatively, adjusting the RF power supply systems 154 and 156a–156d via electronic signals from RF control system 186) so as to create the desired plasma profile that provides the desired process result.

Electrode Assembly Vacuum Seals

With reference again to FIG. 3, in the present design, upper electrode 54 is made of a single piece of metal, so only two vacuum seals V1 and V2 are required to seal electrode assembly 50. Vacuum seals V1 and V2 are, for example, o-rings. Seal V1 is placed on ledge 26L formed in chamber wall 26 on the interior 30 side. Ledge 26L also supports insulator ring 70. Seal V2 is placed between insulator ring top surface 70S and modular housing dielectric side wall 75. The reduced number of vacuum seals associated with electrode assembly 50 makes system 10 more resistant to failure, and allows for the assembly to be easily maintained.

Electrode Assembly with Corrugated Electrodes

As described above, the coupling between segment electrode 60 and upper electrode 54 is capacitive. With the surfaces of both electrodes being planar, the capacitance (neglecting fringe field effects) is approximated by a parallel plate capacitor, whose capacitance is given by $C=\epsilon A/d$, where $\epsilon$ is the dielectric constant for the material between the upper and lower plates of the capacitor, A is the total area of electrode segments 62, and d is the distance between the plates. The capacitive coupling can be increased by bringing the plates toward each other. However, to do so would increase the risk of high voltage breakdown of the dielectric between the plates. There is also a risk of vibration causing the capacitance to vary significantly, since at small gap sizes, the system becomes extremely sensitive to small gap changes. (e.g., if a gap Ga is greater than a gap Gb, and if the variation in the gap distance is $\delta$, then the effect on the capacitance of Ga+$\delta$ versus Gb+$\delta$ is less.)

The alternative to reducing the gap between electrodes (plates) to change the capacitive coupling is to change the capacitor area A. In the present invention, simply increasing the planar area of segment electrode 60 may be possible, but doing so affects the overall shape of the RF electric field associated with the segment electrode, and so it is not a preferred option. However, with reference to FIG. 8 and electrode assembly 400 shown therein, by changing the area of lower surface 60L of segment electrode 60 and the upper surface 54U of upper electrode 54 by adding corrugations 402 with spaces 404 to the segmented electrode to form a corrugated segmented electrode 406, and adding corrugations 410 with spaces 412 to the upper electrode to form a corrugated upper electrode 414, a significant increase in capacitor area can be realized. Corrugations 402 and 410 are offset so that spaces 404 are aligned with corrugations 410 and corrugations 402 are aligned with spaces 412. The latter are sized to be slightly larger than corrugations 402, i.e., the width of corrugations 402 is slightly less than the width of spaces 412.

Figure 8:
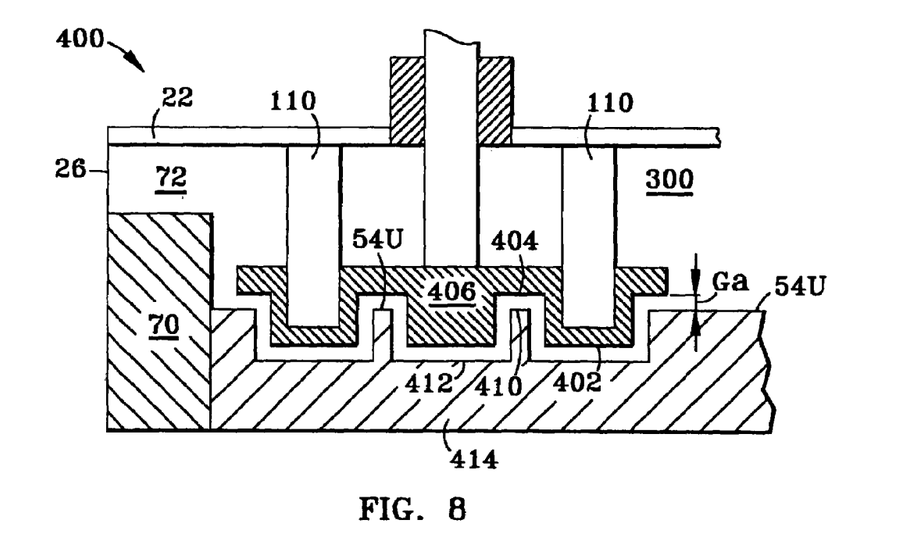
FIG. 8 is a schematic diagram of a portion of an electrode assembly according to a second embodiment of the present invention, which includes a corrugated segmented electrode and a corrugated upper electrode.

The resulting increase in capacitor area brings a significant decrease in the sensitivity of the capacitance to small changes of the $\overline{\text{mean}}$ size, $G_m$, of controlled gaps Ga–Gd between corrugated segmented electrode 406 and corrugated upper electrode 414. This makes system 10 easier to control and makes electrode assembly 400 more immune to vibration.

In a preferred embodiment of electrode assembly 400, actuators 110 may protrude into certain of corrugations 402 and be attached to the electrode at or near the bottom of the corrugations. This allows for use of larger actuators 110 having a longer stroke, such as a piezoelectric stack transducer. This is an important feature, since long stroke actuators are desirable, but also typically require more space than is available. Here, corrugations 402 provide adequate space for such a long stroke actuator.

Accordingly, electrode assembly 400 having corrugated segmented electrode 406 solves the same problems as electrode assembly 50 having (planar) segmented electrode 60, described above. In addition, electrode assembly 400 has increased capacitive coupling by virtue of an increased capacitance area, and hence more control of plasma uniformity, but still without undue sensitivity to the size of controlled gaps Ga–Gd, which would result in lower system reliability. The present embodiment also provides for better cooling of electrode assembly 400 than electrode assembly 50, since the electrode area exposed to cooling fluid 300 is larger and the gap where fluid is circulating is larger.

Electrode Assembly with Segmented Electrodes without Actuators

Figure 9:
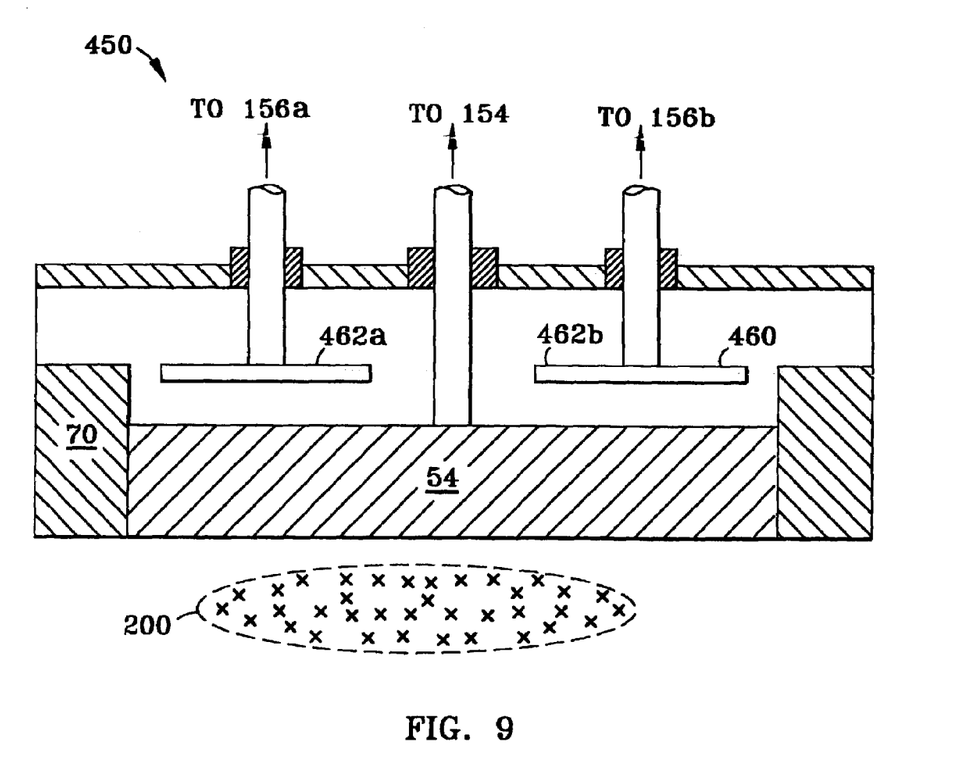
FIG. 9 is a schematic cross-sectional diagram of a third embodiment of the electrode assembly according to the present invention, including a segmented electrode similar to the segmented electrode in FIGS. 2 and 3B, but without actuators.

With reference now to FIG. 9, there is shown an electrode assembly 450 with a segmented electrode 460 with electrode segments 462a and 462b visible in cross-section. Electrode assembly 450 is of an alternative embodiment of electrode assembly 50 described above and is similar thereto but for the absence of actuators 110 and the corresponding actuator control system 184. In the present embodiment, control over plasma 200 is achieved via adjustment of RF power delivered from external RF power supplies 154 and 156a–156d, in a manner similar to that described above in connection with segmented electrode 60. While electrode assembly 450 lacks the flexibility of electrode assembly 50, it provides a good alternative for specialized plasma processing applications, particularly where low cost is more important than high performance. Electrode assembly 450 solves the basic problems as electrode assembly 50 discussed above in connection with the preferred embodiment, but does so over a narrower range of operating conditions.

Electrode Assembly with Segmented Electrode and Liquid and/or Solid Dielectric

Figure 10:
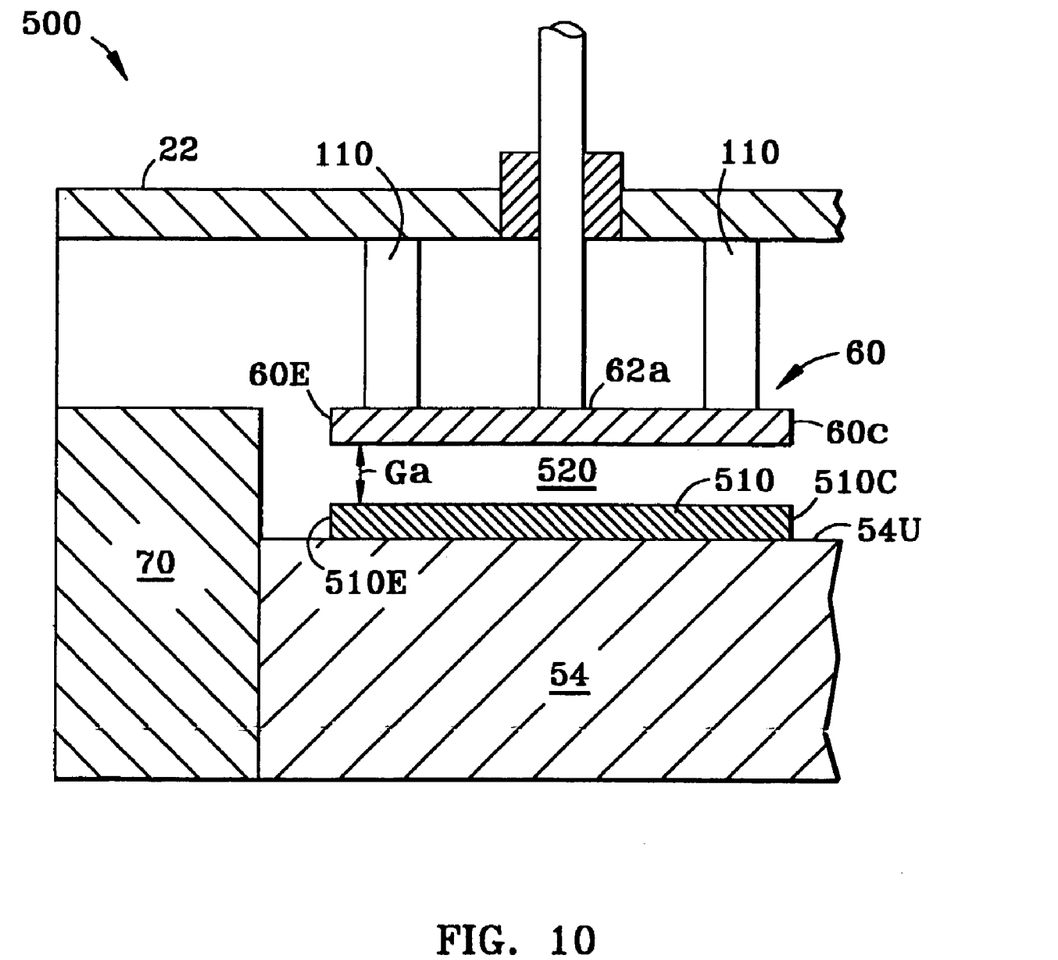
FIG. 10 is a schematic cross-sectional diagram of a portion of an electrode assembly according to a fourth embodiment of the present invention, which includes a solid dielectric layer provided between one or more of the electrode segments and the upper electrode.

With reference now to FIG. 10, there is shown a portion of an electrode assembly 500 according to the present invention, in which the dielectric in one or more of controlled gaps Ga–Gd (only Ga is shown in cross-section) includes a combination of a solid dielectric layer 510 and a liquid dielectric 520, the latter preferably in the form of cooling fluid 300. The present embodiment of electrode assembly 500 is described in combination with (planar) segmented electrode 60, though corrugated segmented electrodes 406 or 460 could also be used.

Dielectric layer 510 can be affixed to or supported by upper surface 54U of upper electrode 54, or affixed to segmented electrode 60. In the case where dielectric 510 is attached to upper electrode 54, as shown in FIG. 10, the preferred form of dielectric layer 510 is an annular disc having a center edge 510C and an outer edge 510E, both of radii equal to radii of center and outer edges of the segmented electrode, 60C and 60E, respectively. Where dielectric 510 is attached to the segment electrode 60, its shape and size are the same as the segment electrode itself. Dielectric layer 510 can be made of any of a wide variety of dielectric materials, such as $Al_2O_3$, polyimide, quartz, PTFE (Teflon), Rexolite, etc. Subject to the constraint of allowing sufficient range of motion of segmented electrode 60 via actuators 110, various sized dielectric layers 510 having different thicknesses and dielectric constants can be used and interchanged to achieve a desired capacitance range. In the case of segmented electrode 460 in which the electrode segments are not movable, dielectric layer 510 can fill the entirety of gaps Ga–Gd. In this case, controlled gaps Ga–Gd can be made as small as 50 microns. The inclusion of a solid dielectric provides an additional level of protection from voltage breakdown since the aforementioned solid dielectric materials typically have higher breakdown voltages than liquid dielectrics.

Maintenance of the Segmented Electrode

With reference again to FIGS. 2 and 3, segmented electrode assembly 50 is, in a preferred embodiment, entirely enclosed within modular housing 74 that is readily removable from plasma chamber 20. This allows for easy field maintenance of plasma processing system 10. The preferred method of maintaining system 10 involves replacing a first electrode assembly 50 in its entirety (i.e., as a module) with a same or different (i.e., second) assembly (module) 50. The electrode assemblies 50 are preferably calibrated during construction, e.g., at the factory. A number of electrode assemblies 50 with various numbers of segment electrodes and calibrations can be interchanged in system 10 to accommodate various processes.

Consider, for example, the situation where a new process calling for a second plasma density profile different than a first plasma density profile is to be carried out using system 10. Using the present invention, the existing (first) electrode assembly 50 for producing the first plasma density profile can be removed and replaced with a second electrode assembly designed and calibrated for the new process associated with a second plasma density profile. This eliminates an end-user having to perform reconfigurations and recalibrations of system 10. Here, the first and second plasma density profiles can be the same or differ substantially from one another. In addition, the two process associated with the first and second plasma density profiles can be carried out on first and second wafers, or the same wafer (i.e., the first and second wafers can be the same wafer).

In a preferred embodiment of system 10 incorporating modular housing 74, replacing segmented electrode assembly 50 involves breaking only one vacuum seal (namely, vacuum seal V1) when removing the assembly from plasma chamber 20. Having electrode assembly 50 be so easily removable reduces the likelihood of a vacuum leak after removal and replacement of the electrode assembly. This is favorably compared to prior art segmented electrode system 700 in FIG. 1, where many more vacuum seals would need to be broken to replace the electrode assembly. Furthermore, in system 10 of the present invention, there is only one process gas line 145 and two cooling fluid lines, 182i and 182o, that need to be disconnected, further reducing the likelihood of a system malfunction following the installation of a new (second) segmented electrode assembly 50. A new operating parameter data set for database 190 should also be provided with the new (second) electrode assembly, and should be installed in main control system 1184, so that processing system 10 could be optimally operated with the new (second) electrode assembly 50.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A method of adjusting a plasma density profile of a plasma contained in an interior region of a plasma reactor, so as to cause the plasma density profile to match or approach a desired plasma density profile, the method comprising the steps of:
   a) providing, adjacent the interior region, an electrode assembly having an upper electrode with an upper and lower surface, with the upper electrode lower surface facing the interior region, and two or more electrode segments arranged adjacent to the upper electrode upper surface so as to capacitively couple with the upper electrode, said two or more electrode segments being independently movable relative to said upper electrode upper surface;
   b) operating the plasma reactor and creating a database containing information relating to a plurality of parameters associated with a plurality of operating conditions corresponding to a plurality of different plasma density profiles;
   c) determining the plasma density profile by operating the plasma reactor to expose a substrate to the plasma and measuring the effect of the plasma on the substrate;
   d) using the database of said step b), comparing said determined plasma density profile in said step c) to the desired plasma density profile; and
   e) altering said determined plasma density profile to approach the desired plasma density profile by moving one or more electrode segments.

2. A method according to claim 1, wherein said step c) of determining a plasma density profile includes etching a substrate with the plasma and measuring the etch properties of the substrate.

3. A method according to claim 1, wherein said step c) of determining a plasma density profile includes plasma depositing a material on a substrate with the plasma and measuring a deposition profile on the substrate.

4. A method according to claim 1, wherein said step b) includes blanket etching a plurality of substrates and measuring the effect of the etch on the substrates.

5. A method according to claim 1, wherein said step b) includes blanket deposition on a plurality of substrates and measuring the effect of the deposition on the substrates.

6. A method of processing a substrate with a plasma having a plasma density profile approaching a desired plasma density profile, comprising the steps of:
   a) providing a plasma reactor chamber;
   b) providing one or more plasma gases into an interior region of the plasma reactor chamber;
   c) providing RF power to an upper electrode and to two or more electrode segments, disposed adjacent to the upper electrode, are capacitively coupled to the upper electrode, and are moveable relative to an upper surface of the upper electrode, so as to form the plasma having an associated first plasma density profile in the interior region;
   d) measuring said first plasma density profile;
   e) adjusting one or more of the two or more electrode segments relative to the upper electrode so as to alter the plasma density profile to form a second plasma density profile that matches or approaches the desired plasma density profile;
   f) placing a substrate in the interior region onto the substrate support member; and
   g) processing the substrate with said second plasma density profile.

7. A method according to claim 6, wherein said measuring of said first plasma density profile in said step d) is accomplished by performing one of blanket plasma etching and blanket plasma deposition of a bare substrate, and measuring the effect on the substrate.

8. A method of processing a substrate with a plasma having a plasma density profile approaching a desired plasma density profile, comprising the steps of:
   a) providing a plasma reactor chamber;
   b) providing one or more plasma gases into an interior region of the plasma reactor chamber;
   c) providing RF power to an upper electrode and to two or more electrode segments so as to form the plasma having an associated first plasma density profile in the interior region, wherein the two or more electrode segments are disposed adjacent to the upper electrode, are capacitively coupled to the upper electrode, and are moveable relative to an upper surface of the upper electrode, and wherein the two or more electrode segments comprise first corrugations and first spaces on a lower surface thereof and the upper electrode comprises second corrugations and second spaces on an upper surface thereof and the first corrugations are aligned with the second spaces;
   d) measuring said first plasma density profile;
   e) adjusting one or more of the two or more electrode segments relative to the upper electrode so as to alter the plasma density profile to form a second plasma density profile that matches or approaches the desired plasma density profile;
   f) placing a substrate in the interior region onto the substrate support member; and
   g) processing the substrate with said second plasma density profile.

9. A method according to claim 8, wherein said measuring of said first plasma density profile in said step d) is accomplished by performing one of blanket plasma etching and blanket plasma deposition of a bare substrate, and measuring the effect on the substrate.

10. A method of plasma processing first and second substrates with first and second plasma density profiles from first and second electrode assemblies, respectively, comprising the steps of:
    a) providing a plasma reactor chamber comprising said first electrode assembly;
    b) processing the first substrate using said plasma reactor chamber having a first plasma density profile associated with said first electrode assembly;
    c) replacing said first electrode assembly with a second electrode assembly associated with a second plasma density profile; and
    d) processing the second substrate using said plasma reactor chamber and said second plasma density profile,
    wherein at least one of the first and second electrode assemblies includes an upper electrode and to two or more electrode segments, the two or more electrode segments being disposed adjacent to, moveable relative to, and capacitively coupled to the upper electrode, and
    wherein the two or more electrode segments comprise first corrugations and first spaces on a lower surface thereof and the upper electrode comprises second corrugations and second spaces on an upper surface thereof and the first corrugations are aligned with the second spaces.

11. A method according to claim 10, wherein said first plasma density profile and said second plasma density profile differ substantially from one another.

12. A method according to claim 10, wherein said first and second substrate are the same substrate.

* * * * *